United States Patent [19]

Russell et al.

[11] Patent Number: 5,144,157

[45] Date of Patent: Sep. 1, 1992

[54] PIN DIODE DRIVER CIRCUIT FOR RADAR SYSTEM

[75] Inventors: Mark E. Russell, Londonderry, N.H.; David C. Miller, Greenfield, Mass.

[73] Assignee: Raytheon Company, Lexington, Mass.

[21] Appl. No.: 763,852

[22] Filed: Sep. 23, 1991

[51] Int. Cl.$^5$ .......................... H03K 17/60; H03K 3/01
[52] U.S. Cl. ..................................... 307/270; 307/255; 307/259; 307/267; 307/268; 307/317.1; 307/319; 307/300; 307/263; 307/17.2; 307/262
[58] Field of Search .......................... 307/300, 255–256, 307/267–268, 259, 317.1, 319, 270, 263; 333/103–104, 262, 17.2

[56] References Cited

U.S. PATENT DOCUMENTS

| | | | |
|---|---|---|---|
| 3,281,703 | 10/1966 | Bladen | 307/315 |
| 3,912,949 | 10/1975 | Kalisvaart | 307/300 |
| 4,510,472 | 4/1985 | Bickley et al. | 307/317.1 |
| 5,003,198 | 3/1991 | Bell | 307/315 |

OTHER PUBLICATIONS

IBM Tech Disc Bul. vol. 30, No. 11 Apr. 1988 "Electronically Switchable Interface Circuit with Multiple E1A Protocol Drivers & Receivers" 307/270.

IBM Tech Disc Bul vol. 27, No. 2, Jul. 1984 "Driver/Recevier Pair for Low Voltage Inverter Circuit" Dorlen et al. 307/270.

Primary Examiner—Stanley D. Miller
Assistant Examiner—Margaret Rose Wambach
Attorney, Agent, or Firm—Donald F. Mofford; Richard M. Sharkansky

[57] ABSTRACT

A timing delay circuit includes a first transistor having a control electrode coupled to an input terminal, a reference electrode coupled to a first DC bias terminal and an output electrode coupled to an output terminal of the timing delay circuit. The timing delay circuit further includes a second transistor having a control electrode coupled to the input terminal, a reference electrode coupled to a second DC bias terminal and an output electrode. The timing delay circuit further includes a third transistor having a control electrode coupled to the output electrode of the second transistor, a reference electrode coupled to the second DC bias terminal and an output electrode coupled to the output terminal of the timing delay circuit.

17 Claims, 2 Drawing Sheets

PIN DIODE DRIVER CIRCUIT FOR RADAR SYSTEM

BACKGROUND OF THE INVENTION

This invention relates generally to driver circuits and more particularly to PIN diode driver circuits.

As is known in the art, a radar system typically includes an antenna, a transmitter and a receiver. A radar system transmitter generally includes an oscillator such as a magnetron oscillator, which may be turned on and off to generate a series of pulses. The pulses are fed to the antenna and emitted from the radar system.

It is also known in the art that RF receivers used in such radar systems generally include circuit components, such as low noise amplifiers (LNAs) which are susceptible to burn out from high power RF signals. High RF input signal levels provided by leakage from the radar's transmitter or from hostile jammers, for example, pose a threat to those circuit components of the RF receiver which are susceptible to burn out as a result of high incident power levels. Therefore, RF receivers having circuits susceptible to burn out need to be protected from input signals having high power levels.

One approach used to protect an RF receiver in a radar system is an active PIN diode limiter circuit. An active PIN diode limiter circuit includes a driver circuit and at least one, preferably two or more, PIN diodes. The PIN diodes are mounted in shunt between a transmission line and a reference potential. The active limiter is placed between the input signal source, such as the antenna for example, and the circuit which needs protection such as the RF receiver.

The active limiter operates in two basic modes. While operating in its normal, non-limiting mode, the driver circuit places the PIN diodes in a reverse biased conductive state and thus the active limiter provides a relatively low insertion loss characteristic to input signals fed thereto. To operate the active limiter in a limiting mode the driver circuit places the PIN diodes in a forward biased conductive state and thus the active limiter provides a very high insertion loss characteristic to input signals fed thereto.

The radar system operates in two modes. The first mode of operation is the receive mode. In the receive mode, the active limiter in its low loss state couples RF signals from the antenna to the receiver with minimum attenuation of the RF signals. However, if the input signal to the limiter exceeds a certain predetermined threshold, the driver circuit provides a forward bias voltage to the PIN diodes to place the active limiter into its limiting mode. In its limiting mode the active limiter provides a relatively high insertion loss characteristic to signals being fed from the antenna to the receiver.

The second mode of operation is the transmit mode. When the radar system is in the transmit mode, the transmitter provides a signal to the antenna and the signal is emitted from the radar system.

In those radar systems which use a common antenna to both transmit and receive signals, a component such as a duplexer, a circulator or the like provides isolated signal paths which couple the transmitter and the receiver to the common antenna. Components such as duplexers, circulators or the like, however, have a finite isolation characteristic. Thus, during transmit, portions of the transmit signal may leak back to the receiver due to the relatively poor isolation characteristics of the components which provide the receive path and transmit path to the common antenna.

To protect the receiver from the so-called leakage signals which are provided during the transmit mode, the active limiter must be in its limiting mode during the time when the transmitter provides a transmit signal to the antenna. In this instance, the driver circuit provides a forward bias voltage to the PIN diodes of the active limiter and thus places the active limiter in its limiting mode.

A so-called pulsed radar system determines the range to a target by measuring the time it takes a transmitted signal pulse having a predetermined pulse width to travel to the target and return. Once the transmitted signal pulse is emitted by the radar through the antenna, a sufficient time interval must elapse before the radar system transmits another signal pulse. The time interval allows any reflected signals to return to the radar and be detected by the radar's RF receiver before the radar system transmits the next signal pulse. The rate at which the pulses are provided by the radar system's transmitter is called the pulse repetition frequency (PRF).

As mentioned above, the active limiter should provide a high insertion loss characteristic during the time when the transmitter is providing a signal pulse to the antenna. However, the active limiter should provide a low insertion loss characteristic when the transmitter is not providing a signal to the antenna. Thus, the driver circuit should switch the PIN diodes to their high insertion loss state for a length of time substantially corresponding to the pulse width of the pulse signal.

Similarly, the driver circuit should switch the PIN diodes to their low insertion loss state when the transmitter is not providing a pulse signal. Thus, signal pulses reflected from the targets and received by the antenna are coupled to the receiver via the active limiter having a relatively low insertion loss characteristic.

For the active limiter to provide a relatively low insertion loss characteristic when reverse biased, the PIN diodes of the active limiter should have a low resistance. To handle high RF power levels, the diode should have a relatively large cross-sectional area. A PIN diode capable of handling RF signals having high power levels is typically provided having a relatively large cross-sectional area including a thick intrinsic (I) region having a minority carrier lifetime typically of about 450 nanoseconds. Such diodes are generally referred to as high power PIN diodes.

The thick I region provides a relatively insignificant time delay to the injection of charge carriers into the diode to forward bias the diode. The thick I region, however, provides a significant delay in the removal of the charge carriers when the PIN diode switches from the forward bias conductive state to the reverse bias non-conducting state. Thus, it is relatively difficult to rapidly switch high power PIN diodes between their conducting and non-conducting states.

In a radar system having a narrow pulse width and a high PRF, the driver circuit should rapidly switch the PIN diodes between their conducting and non-conducting states. To accomplish this, the driver circuit should alternatively provide a forward bias current and a reverse bias voltage to the PIN diode and thus rapidly move the charge into and out of the PIN diode.

Conventional PIN diode driver circuits are provided by bi-polar junction transistors which are physically small and which in their conductive state provide a relatively high resistance path between the voltage source and the diode. To bias high power PIN diodes, the transistors of conventional driver circuits switch between a positive DC voltage source typically of about 5 volts and a large negative voltage source typically of about 40 volts. Thus, the bi-polar junction transistors provide the forward and reverse bias signals to the PIN diode.

Several problems exist with this approach. First, the relatively high resistance path of the transistor coupled to the PIN diode limits the amount of current which the driver circuit may provide to a load such as a PIN diode for example. This driver circuit induced current limitation may be overcome by providing the driver circuit with a large bias voltage. By using a large negative bias voltage source the driver circuit can provide a large current, generally referred to as a reverse spike current, to the PIN diode. Typically, in the case of a high power PIN diode coupled to the driver, DC voltage supplies in the range of −40 volts are used to provide a large electric field and consequently a large reverse spike current to the PIN diode. Airborne radar systems, however, such as missile radars, are often limited to negative DC voltage supplies typically of about −25V.

A second problem arises when the minority carrier lifetime of the PIN diode is greater than the desired switching speed. The speed at which the diode switches is directly proportional to how rapidly the charge is removed from the diode. The charge will be removed from the diode due to the formation of electron-hole pairs provided in a process referred to as recombination. The minority carrier lifetime of the diode refers to the time it takes for substantially all of the electron-hole pairs to be formed in the diode. A reverse bias voltage provided to the PIN diode will promote the removal of I-region charge thereby increasing the speed at which the diode may switch between its conducting and non-conducting states. Thus when the minority carrier lifetime of the PIN diode is greater than the desired switching speed, the driver circuit should provide a large reverse bias voltage to the PIN diode in a small amount of time.

A third problem arises when the driver circuit should continuously switch a PIN diode between its conducting and non-conducting states. In a radar system having a narrow pulse width and a high PRF, for example, charge is moved into and out of the PIN diode repetitively through the relatively high resistance path of the transistors. Thus, the junction temperature of the driver circuit transistor coupled to the PIN diode rises significantly thereby compromising the reliability of the transistor and therefore compromising the reliability of the driver circuit.

SUMMARY OF THE INVENTION

In accordance with the present invention a timing delay circuit includes a first transistor having a control electrode coupled to an input terminal, a reference electrode coupled to a first DC bias terminal and an output electrode coupled to an output terminal of the timing delay circuit. The timing delay circuit further includes a second transistor having a control electrode coupled to the input terminal, a reference electrode coupled to a second DC bias terminal and an output electrode. The timing delay circuit further includes a third transistor having a control electrode coupled to the output electrode of the second transistor, a reference electrode coupled to the second DC bias terminal and an output electrode coupled to the output terminal of the timing delay circuit. With such an arrangement, a timing delay circuit is provided for use as the output stage of a driver circuit. Transistors provided in this particular arrangement provide a low output impedance characteristic to circuits coupled thereto. The low output resistance of the output electrode of the transistors can provide a large output current for a preselected DC bias voltage. Thus DC voltage supplies having lower voltage levels may be used with such a circuit. A first input signal having a first voltage level fed to the input terminal places the first transistor in its conductive state and the second and third transistors in their non-conductive states. Thus the first input signal provides at the output terminal a first output signal, having substantially the same voltage level as the first input signal. The first output signal may be fed to a PIN diode, for example, to place the PIN diode in its forward bias state. When the first input signal is removed and a second input signal, having a second voltage level of opposite polarity to that of the first voltage level, is fed to the input terminal the first transistor is placed in its non-conducting state. The second input signal however places the second and third transistors in their conductive states. The second transistor provides a time delay before the third transistor switches to its conductive state. Thus the time delay allows the first transistor to switch to its non-conductive state before the third transistor switches to its conductive state. Thus the third transistor rapidly transitions to its conductive state. It is desirable to place the first transistor in its non-conductive state before placing the third transistor in its conductive state because it is desirable to prevent the output current of the first transistor from leaking to the third transistor. Such a leakage current provided to the third transistor from the first transistor prevents the third transistor from being placed into its so-called saturation state. It is desirable to place the third transistor into its saturation state since this provides the third transistor with a voltage-current response characteristic having a steep slope. By placing the third transistor into its saturation state, the second voltage level and a corresponding current is provided to the output terminal and consequently to the PIN diode coupled thereto in a short time interval. This so-called reverse voltage enables the rapid removal of the charge from the I-region of the PIN diode. Moreover, the reverse voltage promotes the rapid re-combination of hole-electron pairs. Thus the PIN diode is rapidly switched from its conductive state to its non-conductive state.

In accordance with a further aspect of the present invention, a driver circuit includes a voltage translator circuit having an input terminal and an output terminal with the input terminal being coupled to an input terminal of the driver circuit. A current amplification circuit is provided having an input terminal and an output terminal with the input terminal of the current amplification circuit being coupled to the output terminal of the voltage translator circuit. The driver circuit further includes a timing delay circuit having an input terminal and an output terminal with the input terminal of the timing delay circuit coupled to the output terminal of the current amplification circuit and the output terminal of the timing delay circuit being coupled to the output terminal of the driver circuit. With such an arrangement a driver circuit which provides a relatively high current output signal is provided. In particular, the driver circuit receives a low current control signal having TTL voltage levels and provides at the output terminal of the driver circuit a high current control signal having predetermined voltage levels. The voltage translator circuit receives the low current TTL control signal and provides at its output terminal a control signal having a predetermined voltage level. The current amplification circuit receives the control signal having the predetermined DC voltage level and provides a control signal having a similar DC voltage level and an amplified current level which is fed to the input terminal of the timing delay circuit. The output terminal of the timing delay circuit is coupled to a load. The timing delay circuit provides further current amplification to control signals and provides a proper timing sequence when providing alternate control signals to the load coupled to the output terminal of the timing delay circuit. If the predetermined DC voltage potentials are selected to have opposite polarities, then such a driver circuit may be used to provide a large forward bias current and a reverse bias voltage to a PIN diode, for example, and thus rapidly switch the diode between its conductive and non-conductive states.

In accordance with a still further aspect of the present invention, the driver circuit further includes a line receiver having a pair of input electrodes and an output electrode; and a charge coupled device driver having an input electrode and an output electrode with the input electrode of the charge coupled device driver coupled to the output electrode of the line receiver and the output electrode of the charge coupled device driver coupled to the input terminal of the voltage translator circuit. With such an arrangement a so-called balanced control signal fed to the line receiver provides at the output terminal of the driver circuit a high current control signal having a predetermined voltage level and a fast slew rate. The line receiver receives a balanced control signal fed thereto and provides at its output terminal a binary TTL control signal having a slow slew rate. The charge coupled device driver receives the TTL control signal having the slow slew rate from the line receiver output terminal. The charge coupled device driver subsequently provides at its output terminal a control signal having a fast slew rate and a CMOS voltage level. The control signal from the charge coupled driver is fed to the input terminal of the voltage translator circuit. Thus, the voltage translator circuit, current amplification circuit and timing delay circuit will provide in response to said control signal, a high current control signal having a fast slew rate. Such a control signal may be used to switch current control devices such as PIN diodes for example.

BRIEF DESCRIPTION OF THE DRAWINGS

The foregoing features of the invention as well as the invention itself may be more fully understood from the following detailed description of the drawings, in which.

DESCRIPTION OF THE PREFERRED EMBODIMENTS

Figure 1:
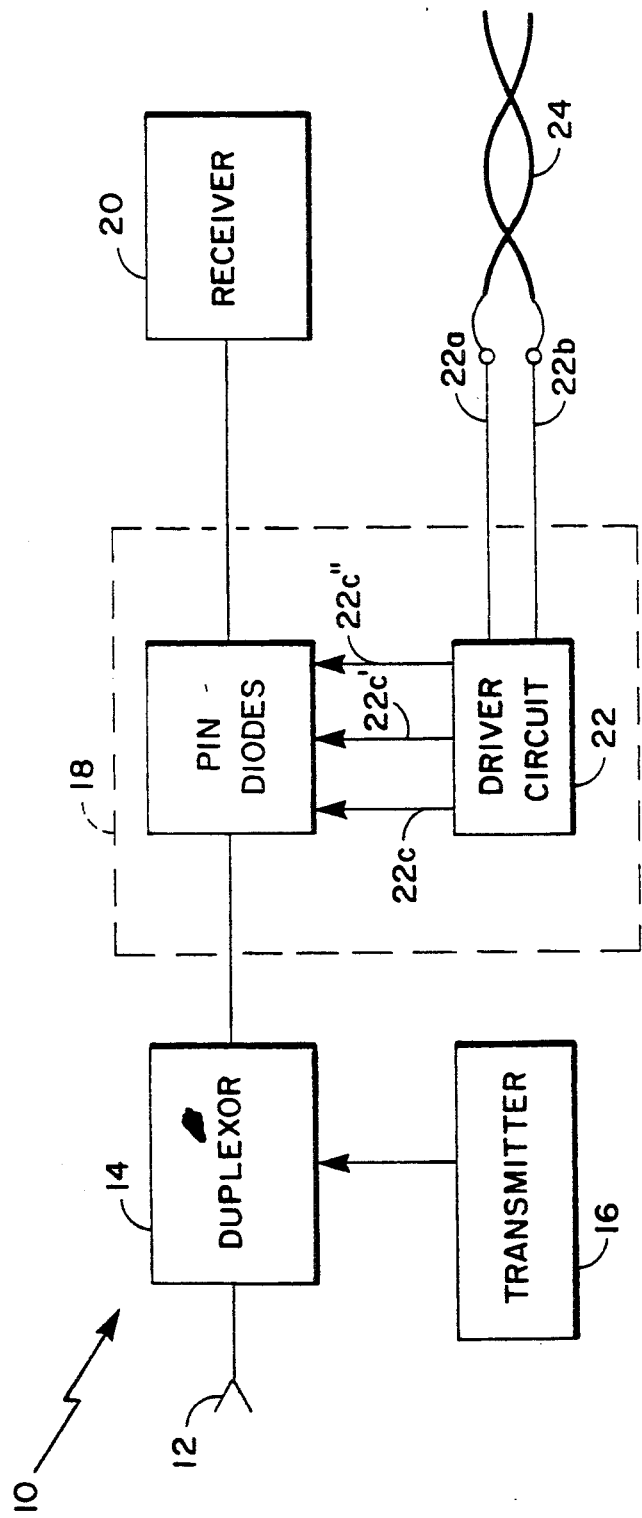
FIG. 1 a block diagram of a radar system.

Referring now to FIG. 1, a radar system 10 is shown to include an antenna 12 coupled to a duplexer circuit 14. Duplexer 14 includes a pair of isolated signal paths (not shown) with a first signal path (not shown) of the duplexer 14 disposed between the antenna 12 and a transmitter 16 and a second signal path (not shown) of the duplexer 14 disposed between the antenna 12 and an active PIN diode limiter circuit (hereinafter limiter) 18. The limiter 18 is provided to couple RF signals from the duplexer 14 to a receiver 20. The limiter 18 is here provided from three PIN diodes (not shown) and a driver circuit 22. A control circuit (not shown) provides control signals to a twisted pair logic line 24. The driver circuit 22 having input terminals 22a, 22b and output terminals 22c, 22c' and 22c'' receives the control signals propagating along the twisted pair logic line 24 at the input terminals 22a, 22b and provides a DC voltage or a DC current at each of the output terminals 22c, 22c' and 22c''.

Each of the output terminals 22c, 22c', 22c'' is coupled to a PIN diode (not shown) of the limiter 18. The driver circuit provides either a forward bias current or a reverse bias voltage at the terminals 22c, 22c', and 22c'' to switch the PIN diodes between their conducting and non-conducting states. Thus the driver circuit 22 switches the limiter 18 between its limiting and non-limiting modes.

Figure 2:
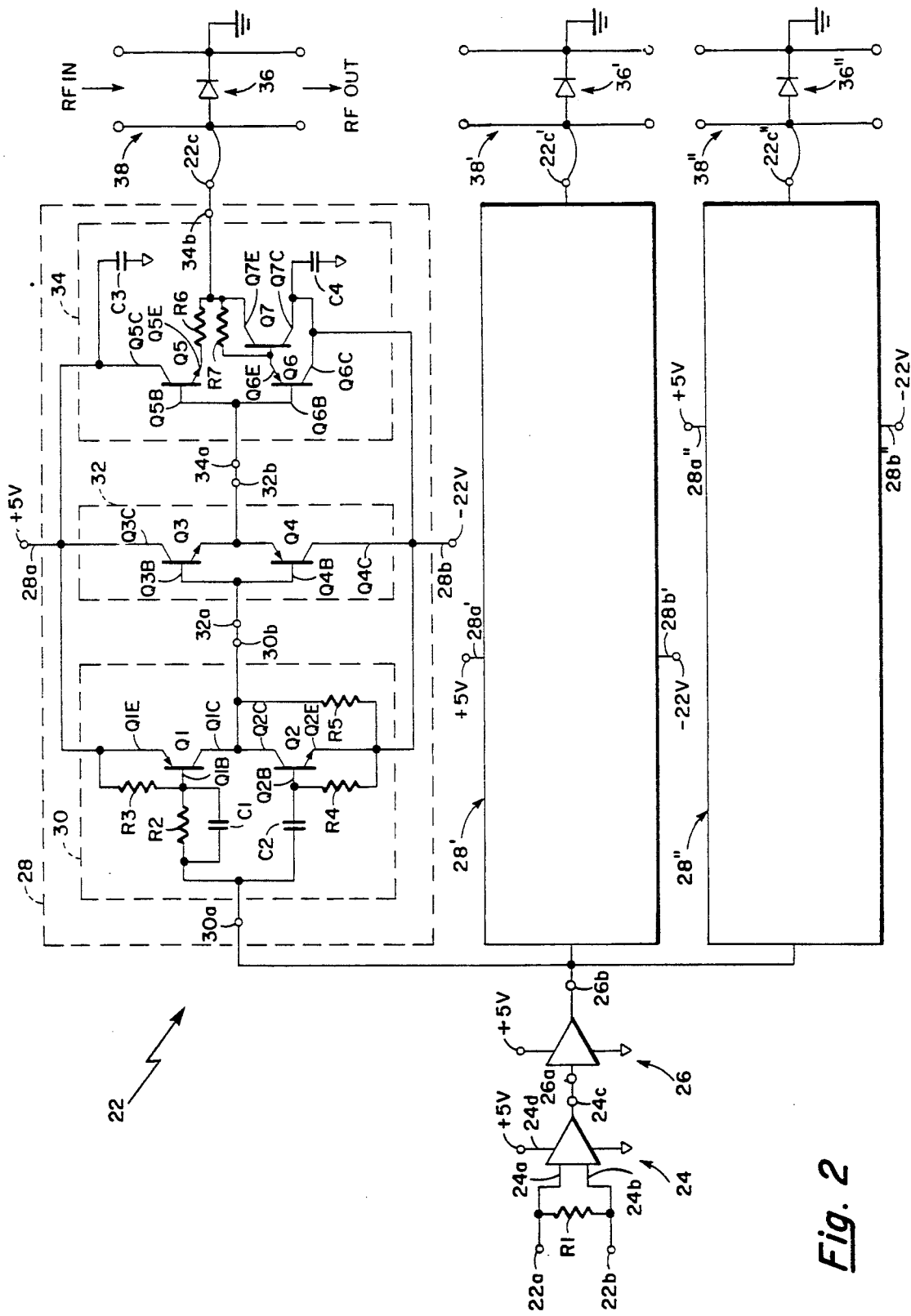
FIG. 2 a schematic diagram of a driver circuit.

Referring now to FIG. 2, a driver circuit 22 having the input terminals 22a, 22b and the output terminals 22c, 22c' and 22c'' includes a line receiver 24, a charge coupled device driver 26, and three driver networks 28, 28', 28''. Each of the driver networks 28, 28', 28'' include a voltage translator circuit 30, a current amplification circuit 32 and a time delay circuit 34. Each of the above recited elements cooperate to provide the fast switching driver circuit 22 capable of providing high current control signals at the output terminals 22c, 22c', 22c''.

The driver circuit 22 responds to control signals fed to the input terminals 22a, 22b. Such control signals are provided by a control circuit (not shown) and may have any one of a plurality of voltage levels.

Here a differential mode logic control signal having voltage levels corresponding to the IEEE RS-422 standard, is fed to the driver circuit 22 via the twisted pair logic lines 24 (FIG. 1) coupled to the input terminals 22a, 22b. The differential mode logic signals are coupled from the input terminals 22a, 22b of the driver circuit 22 to a pair of input terminals 24a, 24b of the line receiver 24.

The line receiver 24 includes an output terminal 24c and a DC bias terminal 24d coupled to a direct current DC voltage source having a voltage potential of +5 volts. The line receiver 24 receives the differential mode control signals fed thereto and provides a binary logic control signal having a TTL voltage level at the output terminal 24c. Thus, for example, when radar system 10 (FIG. 1) is in the transmit mode the differential mode control signal on the twisted pair logic lines 24 (FIG. 1) is selected to provide a logical 1, (i.e. a DC voltage level between 24 volts and 5 volts), at the output terminal 24c of the line receiver 24.

Conversely, when the radar system 10 (FIG. 1) is in the receive mode the differential mode control signal fed to the line receiver 24 is selected to provide a logical 0, (i.e. a DC voltage level between 0 volts and 0.8 volts), at the output terminal 24c of the line receiver 24.

The line receiver 24 may be of the type manufactured by National Semiconductor as Part No. DS9637A however any similar line receiver having equivalent electrical characteristics may also be used. An optional resistor R1, having a DC impedance of 120 ohms, is connected in shunt between the terminals 24a and 24b of the line receiver 24 to provide a matched characteristic impedance to the control signal received from the twisted pair logic lines 24 (FIG. 1). The output terminal 24c of the line receiver 24 is coupled to an input terminal 26a of a charge coupled device (CCD) driver 26.

The CCD driver 26 receives the relatively low current binary TTL control signal having a slow slew rate fed from the line receiver 24 and provides a control signal having a fast slew rate and a CMOS voltage level at an output port 26a. One example of a CCD driver 26 is the type manufactured by Teledyne Semiconductor, Mountain View, Calif., having Part No. TSC430. Alternatively, other types could be used.

From the output port 26a of the CCD driver 26 the control signal is simultaneously fed to the three substantially identical driver networks, 28, 28' and 28". Driver network 28, having a first DC bias terminal 28a coupled to a +5V DC voltage source and a second DC bias terminal 28b coupled to a −22V DC voltage source, includes the voltage translator circuit 30, the current amplification circuit 32 and the time delay circuit 34.

The driver networks 28, 28' and 28" each convert the binary TTL control signals fed thereto from the CCD driver 26 to control signals having predetermined voltage levels. This process is generally referred to as voltage translation. The driver networks 28, 28', 28" further provide current amplification to the control signals having the translated voltage levels. Output control signals from networks 28, 28' and 28" are provided to the output terminals 22c, 22c' and 22c" which are here coupled to PIN diodes 36, 36' and 36".

The voltage translator circuit 30 having an input terminal 30a and an output terminal 30b includes a resistor R2, having a resistance typically of about 27K ohms, serially connected between the input terminal 30a and a base electrode Q1B of a transistor Q1. The transistor Q1 a pnp type transistor may be provided for example as part number 2N2907A, however any transistor having similar electrical characteristics may be used. A capacitor C1, having a capacitance typically of about 100 picofarads (pf), is coupled in parallel with resistor R2 between the input terminal 30a and the base electrode Q1B.

An emitter electrode Q1E of the transistor Q1 is coupled to the first DC bias terminal 28a of the driver network 28. A resistor R3, having a resistance typically of about 16K ohms, is connected between the emitter electrode Q1E and the base electrode Q1B of the transistor Q1. A collector electrode Q1C is coupled to the output terminal 30b of the voltage translator circuit 30.

A second capacitor C2, having a capacitance typically of about 100 pf, is coupled between the input terminal 30a and a base electrode Q2B of a second transistor Q2. The transistor Q2 an npn type transistor may be provided as part number 2N2222A however any transistor having similar electrical characteristics may be used. An emitter electrode Q2E of the transistor Q2 is coupled to the second DC bias terminal 28b of the driver network 28. A resistor R4, having a resistance typically of about 2K ohms, is serially connected between the base electrode Q2B and the emitter electrode Q2E of the transistor Q2. A collector electrode Q2C of the transistor Q2 is coupled to the output terminal 30b of the voltage translator circuit 30. A resistor R5, having a resistance typically of about 10K ohms, is connected in shunt between collector electrode Q2C and emitter electrode Q2E of transistor Q2.

A control signal having a TTL logic level 0 (i.e. a voltage level between 0V and 0.8V) fed to the input terminal 30a provides a potential difference between the terminal 30a and the +5V DC voltage source coupled to the emitter electrode Q1E of transistor Q1 via the DC bias terminal 28a. Because of this voltage potential difference, a current will flow from the +5V DC supply through the emitter-base junction (not numbered) of the transistor Q1.

The resistance of resistor R2 is selected to provide a sufficient base current to maintain the transistor Q1 in its conducting state. In its conducting state, the transistor Q1 provides a relatively low resistance signal path between the +5V DC supply and the output terminal 30b. Thus, when a TTL logic level 0 is fed to the input terminal 30a a DC voltage potential of +5V is provided to the terminal output 30b.

The capacitor C1 provides a signal path to the emitter-base path of the transistor Q1 for a signal current provided by the leading edge of the control signal fed to the input terminal 30a. The capacitance of capacitor C1 is selected to provide a path for an emitter-base current through transistor Q1 for the amount of time required for transistor Q1 to be placed into its conducting state. Thus, capacitor C1 acts as a speed up element during the turn on of transistor Q1.

When a control signal having a TTL logic level 1 (i.e. a voltage level in the range of 2.4V–5V) is fed to the input terminal 30a, no current will flow through resistor R2. The resistance of resistor R3 is selected such that there will not be enough voltage at the emitter base-junction of the transistor Q1 to place the transistor Q1 into its conductive state. Because of the high resistance path provided by the transistor Q1, any leakage current between the base electrode Q1B and the +5V DC supply will flow through the resistor R3 and thus no current will flow through the emitter-base junction of transistor Q1. Therefore Q1 will be placed in its non-conductive state.

When the control signal having logic level 1 is provided to input terminal 30a, a DC voltage typically of about +5V is provided to a first electrode of capacitor C2. In general, when a DC voltage is applied to a capacitor, the capacitor will initially provide a low impedance current path. Thus, the capacitor C2 provides a path for instantaneous current.

However, a capacitor will not provide a path for instantaneous voltage. An instantaneous current will flow through the capacitor C2 and thus a DC voltage of +5V appears across the resistor R4. The instantaneous current through the capacitor C2 and the resultant positive voltage across the resistor R4 is provided across the base-emitter junction of the transistor Q2. The potential difference across the base-emitter junction of the transistor Q2 provides a current flow through the base-emitter junction of the transistor Q2. The large voltage potential difference across the base-emitter junction of the transistor Q2 places the transistor Q2 into its saturated conductive state.

In its conductive state, the transistor Q2 provides a signal path between the −22V DC power supply and the output terminal 30b. Thus, when a TTL logic level 1 is fed to the input terminal 30a, a DC voltage potential of −22V is provided to the output terminal 30b.

After a period of time, however, current will no longer flow through the capacitor C2. Thus no current will flow through the base-emitter junction of the transistor Q2 and therefore the potential difference across the base-emitter junction will decrease until the transistor Q2 is placed in its non-conductive state. In its non-conductive state the transistor Q2 provides a high impedance path between output terminal 30b and the −22V DC supply voltage.

Since the transistor Q1 is also in its non-conductive state, the resistor R5 provides a relatively low resistance path between the −22V DC supply and the output terminal 30b. If no current flows at terminal 30b, no current will flow though the resistor R5 and the −22V DC power supply voltage will be coupled to output terminal 30b through the resistor R5. Thus, the output terminal 30b is provided with a constant DC voltage level typically of about −22V.

When the +5V DC voltage is removed from the first electrode of capacitor C2 and a voltage typically of about 0V DC is provided thereto, the resistor R4 provides a signal path to ground for the stored charge in capacitor C2 and thus allows the capacitor C2 to discharge.

Network 28 further includes a current amplification circuit 32 having input terminal 32a and an output terminal 32b. The input terminal 32a is coupled to the output terminal 30b of the voltage translator circuit 30. Current amplification circuit 32 includes a third transistor Q3, which may be provided for example as part number 2N2222A or any transistor having similar electrical characteristics, and a fourth transistor Q4, which may be provided for example as part number 2N2907A or any transistor having similar electrical characteristics.

The transistor Q3 includes a base electrode Q3B coupled to the input terminal 32a, a collector electrode Q3C coupled to the first DC bias terminal 28a and an emitter electrode Q3E coupled to the output terminal 32b. The transistor Q4 includes a base electrode Q4B coupled to the input terminal 32a, a collector electrode Q4C coupled to the second bias terminal 28b and an emitter electrode Q4E coupled to the output terminal 32b.

Those of skill in the art will recognize that transistors Q3 and Q4 are provided in the push-pull emitter-follower configuration. The transistors Q3 and Q4 provide the current amplification circuit 32 ideally having a unity voltage gain and a high impedance characteristic at the input terminal 32a and a low output impedance characteristic at the output terminal 32b. A control signal having a voltage level typically of about +5V DC provided to the input terminal 32a places the transistor Q3 into its conductive state. Conversely, such a control signal places the transistor Q4 into its non-conductive state. Thus a +5V signal is provided to output terminal 32b.

Similarly, when a control signal having a voltage potential of −22V is provided to input terminal 32a, the base-emitter junction of the transistor Q3 is reverse biased and transistor Q3 is thus placed in its non-conductive state. Conversely the base-emitter junction of the transistor Q4 is forward biased and the transistor Q4 is thus placed in its conductive state and therefore a signal having a voltage potential of −22V is provided to the output terminal 32b.

Current amplification circuit 32 accepts control signals fed to the input terminal 32a and because of the low output impedance of the transistors Q3, Q4 provides high current control signals at the output terminal 32b. The output terminal 32b is coupled to an input terminal 34a of a timing delay circuit 34.

The timing delay circuit 34 having the input terminal 34a and an output terminal 34b includes a fifth transistor Q5 having a base electrode Q5B, coupled to the input terminal 34a, an collector electrode Q5C coupled to the first DC bias terminal 28a of the driver network 28 and a emitter electrode Q5E. The emitter electrode Q5E is resistively coupled to the output terminal 34b as will be further discussed and thus is arranged in the so-called emitter-follower configuration. The transistor Q5 is here provided as part number 2N2222A however any transistor having similar electrical characteristics may be used.

A capacitor C3 having a capacitance typically of about 0.01 μf is connected in shunt between the collector electrode Q5C of the transistor Q5 and ground. When the transistor Q5 is placed in its conductive state thus placing the PIN diode 36 in its forward bias state, the PIN diode 36 draws current and thus a current load is provided to the +5V power supply. When transistor Q5 is placed in its non-conducting state thus placing the PIN diode 36 in its reverse bias state no current is provided from the +5V power supply. This variation in current demand on the +5V power supply causes variations in the power supply voltage.

Capacitor C3 provides filtering of the voltage variations in the +5V DC power supply which are provided during the switching of the PIN diode 36 coupled to terminal 22C. Capacitor C3 prevents the voltage variations from propagating on the +5V DC power supply lines which would otherwise be a source of noise provided to the +5V DC bias line (not numbered). Thus capacitor C3 decouplers voltage variations from the +5V DC bias lines.

A resistor R6, having a resistance typically of about 33 ohms, is serially connected between emitter electrode Q5E and output terminal 34b. Thus resistor R6 provides a serial path between the emitter electrode Q5E and a PIN diode 36.

When a control signal having a voltage level typically in the range of 3.9V-4.2V is fed to the input terminal 34a the control signal provides a voltage level to the base electrode Q5B of the transistor Q5. The potential difference between the base electrode voltage and the collector electrode voltage causes current to flow in the base-emitter junction of transistor Q5. The transistor is thus placed in its conducting state.

The transistor Q5 provides a signal path between the base electrode Q5B and the emitter electrode Q5E. The voltage appearing at emitter electrode Q5E is typically about 0.65V less than the control signal voltage provided to base electrode Q5B due to the voltage drop across the base-emitter junction of the transistor Q5. Thus given the above mentioned control signal fed to the input terminal 34a the voltage at the emitter electrode Q5E is typically in the range of 3.25V to 3.55V.

The resistor R6 acts as a dropping resistor to provide a predetermined current level to the PIN diode 36 when the PIN diode 36 is in the forward bias state. Thus the value of resistor R6 is dependent upon the electrical characteristics of PIN diode 36.

Here, PIN diodes 36, 36', 36" are selected to have a minority carrier lifetime typically of about 350 nsec and a reverse breakdown voltage typically of about 250V. To provide the predetermined current level to the PIN diode 36 having the above mentioned electrical characteristics, the resistor R6 was selected to have a resistance typically of about 33 ohms. If a PIN diode having different electrical characteristics were used, the resistance of R6 would be adjusted accordingly to provide the appropriate predetermined current level when the PIN diode is in the forward bias state.

The timing delay circuit 34 includes a sixth transistor Q6 having a base electrode Q6B, coupled to input terminal 34a, a collector electrode Q6C, coupled to said second DC bias terminal and an emitter electrode Q6E.

The timing delay circuit 34 further includes a seventh transistor Q7 having a base electrode Q7B, coupled to the emitter electrode Q6E, a collector electrode Q7C, coupled to said second DC bias terminal and an emitter electrode Q7E coupled to the output terminal 34b. The transistors Q6 and Q7 are here provided as part number 2N2907A however any transistors having similar electrical characteristics may be used.

A capacitor C4, having a capacitance typically of about 0.01 $\mu f$, is connected in shunt between the collector electrode Q7C and ground. The capacitor C4 provides a similar function as the capacitor C3 previously described above and thus decouples voltage variations from the $-22V$ DC bias lines.

A resistor R7, having a resistance typically of about 350 ohms, is serially connected between the emitter electrode Q6E of the transistor Q6 and the emitter electrode Q7E of the transistor Q7. Compared to the resistor R6, the resistor R7 provides a relatively high resistance current path and thus the resistor R7 prevents cross conductance between transistor Q5 and transistors Q6 and Q7.

When a control signal having a voltage level typically of about $-22V$ is provided to terminal 34a transistor Q5 is placed in its non-conductive state and the transistor Q6 is placed in its conductive state. The emitter electrode Q6E of the transistor Q6 is coupled to the base electrode Q7B of the transistor Q7. The transistor Q6 provides a propagation delay in the range of 5 nsec to 10 nsec to a signal propagating through its base-emitter junction (not numbered). Thus, a signal provided to the base electrode Q6B of the transistor Q6 is provided to the emitter electrode Q6E of the transistor Q6 after the base-emitter junction propagation delay.

Therefore the transistor Q6 provides a timing delay before a signal is provided to the base electrode Q7B of the transistor Q7 thus placing the transistor Q7 in its conductive state.

Such a timing delay is desirable because the transistor Q5 should be placed in its non-conductive state before transistor Q7 is placed in its conductive state. This is desirable since it prevents an output current from the transistor Q5 from being fed to the transistor Q7. Such an output current from the transistor Q5 fed to the transistor Q7 may prevent the transistor Q7 from going into its so-called saturation state.

It is desirable to place the transistor Q7 into its saturation state since this condition provides the fastest speed at which the $-22V$ DC signal may be supplied to output terminal 34b and thus to the PIN diode 36.

The driver circuit is here described providing control signals to a PIN diode. It should be noted, however, that such a driver circuit may be used to provide control signals to a variety of circuits including but not limited to amplifier circuits and IMPATT diodes for example.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A timing delay circuit comprising:
   a first transistor having a control electrode coupled to an input terminal, a reference electrode coupled to a first DC bias terminal and an output electrode coupled to an output terminal of said timing delay circuit;
   a second transistor having a control electrode coupled to said input terminal, a reference electrode coupled to a second DC bias terminal and an output electrode; and
   a third transistor having a control electrode coupled to said output electrode of said second transistor, a reference electrode coupled to said second DC bias terminal and an output electrode coupled to the output terminal of said timing delay circuit.

2. The timing delay circuit of claim 1 wherein said transistors are bi-polar junction transistors and said control electrodes correspond to base electrodes said reference electrodes correspond to collector electrodes and said output electrodes correspond to emitter electrodes.

3. The timing delay circuit of claim 2 wherein said collector and emitter regions of said first transistor having a dopant of a first conductive type and said base region of said first transistor has a dopant of a second conductive type; and
   said collector and emitter regions of said second and third transistors have a dopant of the second conductive type and said base region of said second and third transistors has a dopant of the first conductive type.

4. The timing delay circuit of claim 3 further comprising:
   a first resistor having a first electrode coupled to said output electrode of said first transistor and a second electrode coupled to said output terminal of said timing delay circuit; and
   a second resistor having a first electrode coupled to said output electrode of said second transistor and a second electrode coupled to said output electrode of said third transistor.

5. A driver circuit comprising:
   a voltage translator circuit having an input terminal and an output terminal with said input terminal being coupled to an input terminal of said driver circuit;
   a current amplification circuit having an input terminal and an output terminal with said input terminal of said current amplification circuit being coupled to said output terminal of said voltage translator circuit; and
   a timing delay circuit having an input terminal and an output terminal with said input terminal of said timing delay circuit coupled to said output terminal of said current amplification circuit and said output terminal of said timing delay circuit coupled to an output terminal of said driver circuit; said timing delay circuit further comprising:
   a first transistor having a control electrode coupled to the input terminal of the timing delay circuit, a reference electrode coupled to a first DC bias terminal and an output electrode coupled to said output port of said timing delay circuit;
   a second transistor having a control electrode coupled to the input terminal of the timing delay circuit, a reference electrode coupled to a second DC bias terminal and an output electrode; and a third transistor having a control electrode coupled to said output electrode of said second transistor, a reference electrode coupled to said second DC bias terminal and an output electrode coupled to said second output port of said timing delay circuit.

6. The driver circuit of claim 5 wherein said voltage translator circuit comprises:

a fourth transistor having a control electrode coupled to said input terminal of said voltage translator circuit, a reference electrode coupled to the first DC bias terminal, and an output electrode coupled to said output terminal of said voltage translator circuit; and a fifth transistor having a control electrode coupled to said input terminal of said voltage translator circuit, a reference electrode coupled to the second DC bias terminal and an output electrode coupled to said output terminal of said voltage translator circuit.

7. The driver circuit of claim 6 wherein said current amplification circuit comprises:

a sixth transistor having a control electrode coupled to said input terminal of said current amplification circuit, a reference electrode coupled to said first DC bias terminal and an output electrode coupled to said output port of said current amplification circuit; and a seventh transistor having a control electrode coupled to said input terminal of said current amplification circuit, a reference electrode coupled to said second DC bias terminal and an output electrode coupled to said output port of said current amplification circuit.

8. The timing delay circuit of claim 7 wherein said transistors are bi-polar junction transistors and said control electrodes correspond to base electrodes said reference electrodes correspond to collector electrodes and said output electrodes correspond to emitter electrodes.

9. The timing delay circuit of claim 8 wherein said collector and emitter regions of said first transistor having a dopant of a first conductive type and said base region of said first transistor has a dopant of a second conductive type; and said collector and emitter regions of said second and third transistors have a dopant of the second conductive type and said base region of said second and third transistors has a dopant of the first conductive type.

10. The driver circuit of claim 9 wherein said timing delay circuit further comprises:

a first resistor having a first electrode coupled to said output electrode of said first transistor and a second electrode coupled to said output port of said timing delay circuit; and a second resistor having a first electrode coupled to said output electrode of said second transistor and a second electrode coupled to said output electrode of said third transistor.

11. A driver circuit having a pair of input terminals, and an output terminal comprising:

a line receiver having a pair of input electrodes coupled to said input terminals and an output electrode;

a charge coupled device driver having an input electrode and an output electrode with said input electrode of said charge coupled device driver coupled to said output electrode of said line receiver;

a voltage translator circuit having an input terminal and an output terminal with said input terminal of said voltage transistor circuit being coupled to said output electrode of said charge coupled device driver;

a current amplification circuit having an input terminal and an output terminal with said input terminal of said current amplification circuit being coupled to said output terminal of said voltage translator circuit; and a timing delay circuit having an input terminal and an output terminal with said input terminal of said timing delay circuit coupled to said output terminal of said current amplification circuit and said output terminal of said timing delay circuit coupled to said output terminal of said driver circuit.

12. The driver circuit of claim 11 wherein said voltage translator circuit comprises:

a first transistor having a control electrode coupled to said input terminal of said voltage translator circuit, a reference electrode coupled to a first DC bias terminal of said driver circuit, and an output electrode coupled to said output terminal of said voltage translator circuit; and a second transistor having a control electrode coupled to said input terminal of said voltage translator circuit, a reference electrode coupled to a second DC bias terminal of said driver circuit and an output electrode coupled to said output terminal of said voltage translator circuit.

13. The driver circuit of claim 12 wherein said current amplification circuit comprises:

a third transistor having a control electrode coupled to said input terminal of said first current amplification circuit, a reference electrode coupled to said first DC bias terminal and an output electrode coupled to said output terminal of said current amplification circuit; and a fourth transistor having a control electrode coupled to said input terminal of said current amplification circuit, a reference electrode coupled to said second DC bias terminal and an output electrode coupled to said output terminal of said current amplification circuit.

14. The driver circuit of claim 13 wherein said timing delay circuit comprises:

a fifth transistor having a control electrode coupled to said input terminal, a reference electrode coupled to said first DC bias terminal and an output electrode coupled to said output port of said timing delay circuit;

a sixth transistor having a control electrode coupled to said input terminal, a reference electrode coupled to said second DC bias terminal and an output electrode; and a seventh transistor having a control electrode coupled to said output electrode of said second transistor, a reference electrode coupled to said second DC bias terminal and an output electrode coupled to said second output port of said timing delay circuit.

15. The timing delay circuit of claim 14 wherein said transistors are bi-polar junction transistor and said control electrodes correspond to base electrodes said reference electrodes correspond to collector electrodes and said output electrodes correspond to emitter electrodes.

16. The timing delay circuit of claim 15 wherein said collector and emitter regions of said fifth transistor having a dopant of a first conductive type and said base region of said fifth transistor has a dopant of a second conductive type; and said collector and emitter regions of said sixth and seventh transistors have a dopant of the second conductive type and said base region of said sixth and seventh transistors has a dopant of the first conductive type.

17. The driver circuit of claim 16 wherein said timing delay circuit further comprises:

a first resistor having a first electrode coupled to said output electrode of said fifth transistor and a second electrode coupled to said output terminal of said timing delay circuit; and a second resistor having a first electrode coupled to said output electrode of said sixth transistor and a second electrode coupled to said output electrode of said seventh transistor.

* * * * *